United States Patent
Okushiba

(10) Patent No.: US 10,162,047 B2
(45) Date of Patent: Dec. 25, 2018

(54) LIGHT RECEIVING/EMITTING ELEMENT MODULE AND SENSOR DEVICE USING SAME

(71) Applicant: KYOCERA Corporation, Kyoto-shi, Kyoto (JP)

(72) Inventor: Hiroyuki Okushiba, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/105,482

(22) PCT Filed: Dec. 15, 2014

(86) PCT No.: PCT/JP2014/083155
§ 371 (c)(1),
(2) Date: Jun. 16, 2016

(87) PCT Pub. No.: WO2015/093442
PCT Pub. Date: Jun. 25, 2015

(65) Prior Publication Data
US 2016/0320472 A1  Nov. 3, 2016

(30) Foreign Application Priority Data

Dec. 16, 2013 (JP) ................................ 2013-259276

(51) Int. Cl.
| | |
|---|---|
| G01B 11/14 | (2006.01) |
| G01S 7/481 | (2006.01) |
| G01S 17/02 | (2006.01) |
| H01L 31/0232 | (2014.01) |
| H01L 31/173 | (2006.01) |
| H01L 25/16 | (2006.01) |
| G01S 17/42 | (2006.01) |

(52) U.S. Cl.
CPC ............ G01S 7/4811 (2013.01); G01S 17/026 (2013.01); G01S 17/42 (2013.01); H01L 25/167 (2013.01);
(Continued)

(58) Field of Classification Search
CPC ...... G01S 7/4811; G01S 17/026; G01S 17/42; H01L 25/167; H01L 31/02325;
(Continued)

(56) References Cited

U.S. PATENT DOCUMENTS

| | | | |
|---|---|---|---|
| 4,902,115 A * | 2/1990 | Takahashi | G02B 5/005 348/335 |
| 5,488,468 A | 1/1996 | Kawanishi et al. | |
| 2012/0133956 A1 | 5/2012 | Findlay et al. | |
| 2012/0235271 A1* | 9/2012 | Momose | H01L 31/109 257/447 |
| 2014/0264392 A1 | 9/2014 | Okushiba | |
| 2014/0376113 A1* | 12/2014 | Guenter | G02B 9/00 359/754 |

FOREIGN PATENT DOCUMENTS

| | | |
|---|---|---|
| JP | H05-175545 A | 7/1993 |
| JP | U05-062881 U | 8/1993 |

(Continued)

OTHER PUBLICATIONS

Office Action dated Feb. 14, 2017 issued by the Japan Patent Office in counterpart Japanese Patent Application No. 2015-553532, with concise explanation, 4 pages.
(Continued)

*Primary Examiner* — Jamil Ahmed
(74) *Attorney, Agent, or Firm* — Procopio Cory Hargreaves and Savitch LLP

(57) ABSTRACT

A light receiving/emitting element module includes: a substrate; a light emitting element disposed on one principal face of the substrate; a light receiving element disposed on
(Continued)

the one principal face and disposed next to the light emitting element in a first direction; and an optical element located away from the one principal face, and having a first principal face, and a second principal face. The optical element includes a first lens for the light emitting element, and a second lens for the light receiving element. The first lens and the second lens are disposed side by side in the first direction, and a curved surface defining the first lens and a curved surface defining the second lens which are disposed on at least one of the first principal face and the second principal face, intersect each other.

14 Claims, 9 Drawing Sheets

(52) U.S. Cl.
CPC ...... H01L 31/02325 (2013.01); H01L 31/173 (2013.01); H01L 2924/0002 (2013.01)

(58) Field of Classification Search
CPC ....... H01L 31/173; H01L 31/02; H01L 31/12; H01L 31/09; H01L 2924/0002; G02B 9/00; G02B 5/005; G02B 13/18; G02B 21/02; G02F 1/13
See application file for complete search history.

(56) References Cited

FOREIGN PATENT DOCUMENTS

| | | | | | |
|---|---|---|---|---|---|
| JP | H05-312948 | A | | 11/1993 | |
| JP | 08-011223 | A | | 1/1996 | |
| JP | H08-032106 | A | | 2/1996 | |
| JP | 08088399 | A | * | 4/1996 | ............ H01L 31/12 |
| JP | H08-088399 | A | | 4/1996 | |
| JP | 2001-168376 | A | | 6/2001 | |
| JP | 2003-8051 | A | | 1/2003 | |
| JP | 2003-149409 | A | | 5/2003 | |
| JP | 2013-131601 | A | | 7/2013 | |
| WO | 2013/065668 | A1 | | 5/2013 | |

OTHER PUBLICATIONS

International Search Report dated Jan. 20, 2015 issued by the Japanese Patent Office for International Application No. PCT/JP2014/083155.

Extended European Search Report dated Jul. 4, 2017, issued by the European Patent Office in counterpart European Patent Application No. 14 87 2504.7.

* cited by examiner (a)

(b)

(a)

(b)

(a)

(b)

LIGHT RECEIVING/EMITTING ELEMENT MODULE AND SENSOR DEVICE USING SAME

TECHNICAL FIELD

The present invention relates to a light receiving/emitting element module and a sensor device using the light receiving/emitting element module.

BACKGROUND ART

There have heretofore been proposed various sensor devices of a type which detects the characteristics of a to-be-irradiated object by applying light to the to-be-irradiated object by a light emitting element and receiving specular reflected light and diffuse reflected light resulting relatively from the light incident on the to-be-irradiated object by a light receiving element. These sensor devices have been utilized for wide range of application fields, including, for example, photo interrupters, photo couplers, remote control units, IrDA (Infrared Data Association) communication devices, optical fiber communications equipment, and original size sensors.

As an example of such sensor devices in use, there is known a sensor device comprising a light emitting element and a light receiving element mounted on one single substrate, and lenses adapted to the light emitting element and the light receiving element, respectively (refer to Japanese Examined Patent Publication JP-B2 2939045, for example).

In recent years, however, higher-than-ever sensing capability has been sought after, which makes it difficult to achieve desired high performance capability even with use of the sensor device disclosed in the literature given above. This has created an increasing demand for a sensor device having even higher sensing capability and a light receiving/emitting element module that achieves the sensor device.

The invention has been devised in view of the circumstances as discussed supra, and accordingly an object of the invention is to provide a light receiving/emitting element module having high sensing capability, and a sensor device incorporating the light receiving/emitting element module.

SUMMARY OF INVENTION

The invention provides a light receiving/emitting element module comprising: a substrate; a light emitting element disposed on one principal face of the substrate; a light receiving element disposed on the one principal face of the substrate and disposed next to the light emitting element in a first direction; and an optical element located away from the one principal face of the substrate, the optical element comprising a first principal face facing the one principal face, and a second principal face opposed to the first principal face, the optical element comprising a first lens configured to direct light from the light emitting element, to a to-be-irradiated object, and a second lens configured to direct light reflected from the to-be-irradiated object, to the light receiving element, the first lens and the second lens being disposed side by side in the first direction, a curved surface defining the first lens and a curved surface defining the second lens which are disposed on at least one of the first principal face and the second principal face, intersecting each other.

The invention provides a sensor device comprising: the light receiving/emitting element module described above; and a control circuit which is electrically connected to the light receiving/emitting element module and configures to control the light receiving/emitting element module, light being applied to a to-be-irradiated object from the light emitting element, and based on a current output which is outputted from the light receiving element in response to reflected light from the to-be-irradiated object, at least one of positional information, distance information, and surface information as to the to-be-irradiated object being detected.

The light receiving/emitting element module pursuant to the invention can achieve high sensing capability. Moreover, the sensor device employing the light receiving/emitting element module is capable of obtaining highly accurate information by virtue of its high sensing capability.

DESCRIPTION OF EMBODIMENTS

Figure 1:
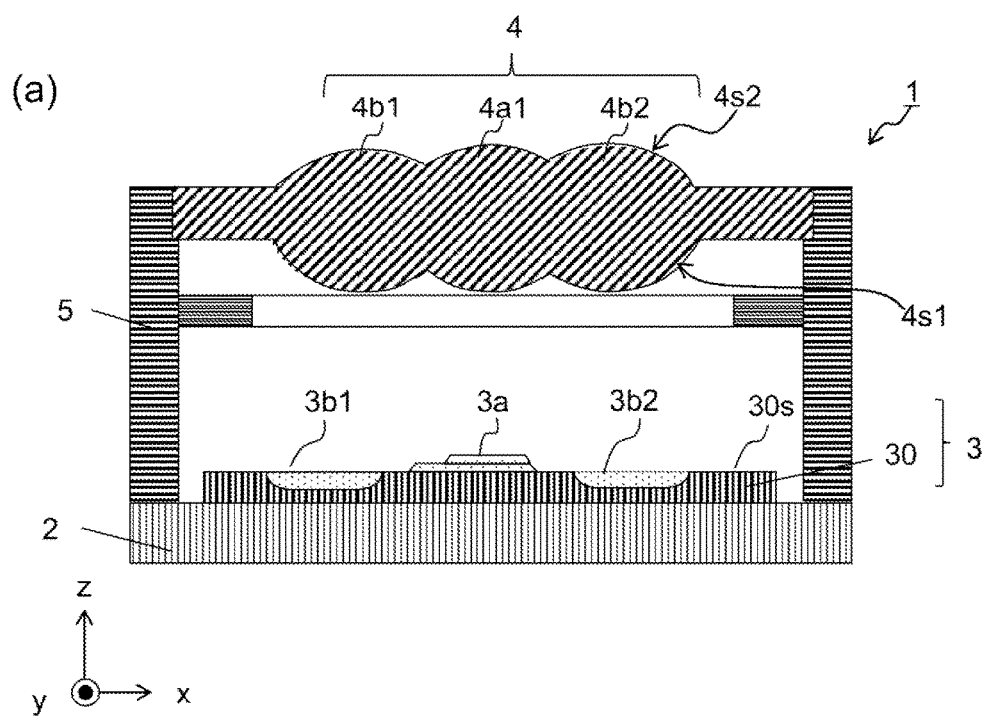
FIG. 1(a) is a sectional view showing an example of a light receiving/emitting element module in the present embodiment.
FIG. 1(b) is a top view of the major part of the light receiving/emitting element module.
Figure 1:
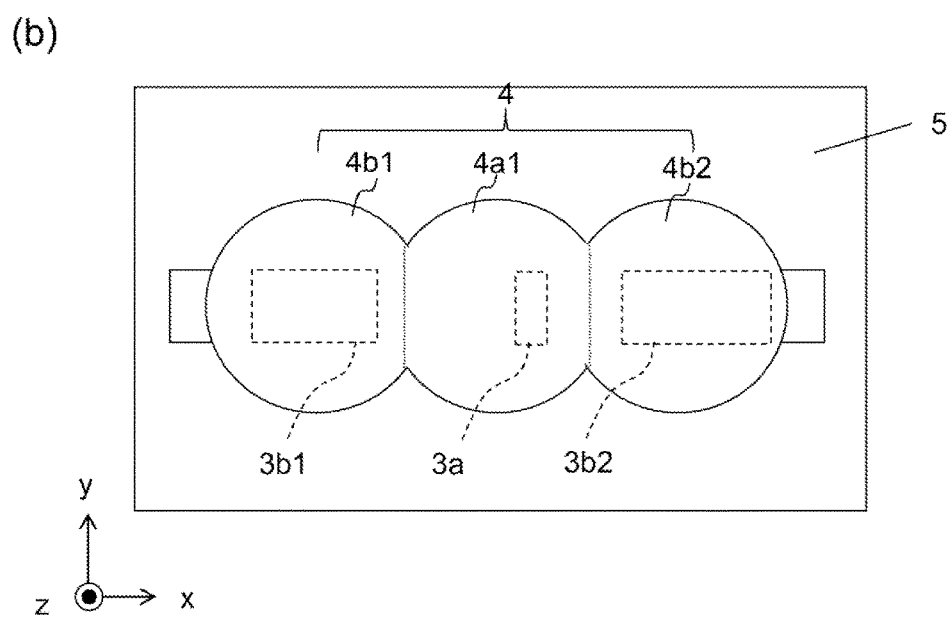

Hereinafter, embodiments of a light receiving/emitting element module and a sensor device employing the light receiving/emitting element module pursuant to the invention will be described with reference to drawings. It is noted that the following examples are considered as illustrative only of the embodiments of the invention, and the invention is not limited to the following embodiments.

(Light Receiving/Emitting Element Module)

A light receiving/emitting element module 1 as shown in FIGS. 1(a) and 1(b) is incorporated in an image forming apparatus such for example as a copying machine or a printer to serve as a sensor device for detecting information, including positional information, distance information, and surface information as to a to-be-irradiated object such as a toner or media. The light receiving/emitting element module 1 is also applicable to a sensor device for detecting surface information as to an object such for example as compacted powder or the skin of a living organism, or an apparatus for detecting positional information as to an object such as a paper sheet and measuring the number of paper sheets or the like. In FIG. 1(b), in the interest of clarity of relative positions of individual constituent components, a light emitting section of a light emitting element 3a and a light receiving section of a light receiving element 3b are indicated by broken lines.

The light receiving/emitting element module 1 comprises a wiring board 2, a light receiving/emitting element 3 disposed on the upper surface of the wiring board 2, and an optical element 4. The light receiving/emitting element 3 comprises a substrate 30, and a light emitting element 3a and a light receiving element 3b which are disposed on one principal face 30s of the substrate 30. The optical element 4 is located away from the one principal face 30s of the substrate 30. For purposes of convenience, a plane parallel to the one principal face 30s is defined as an XY plane, and a thickness direction of the substrate 30 is defined as a Z direction. Moreover, an X direction is occasionally referred to as a first direction, and a Y direction is occasionally referred to as a second direction which is perpendicular to the first direction. On the one principal face 30s, the light emitting element 3a and the light receiving element 3b are arranged in the first direction (X direction).

In this embodiment, two light receiving elements 3b are provided in correspondence with one light emitting element 3a. Specifically, one light emitting element 3a and two light receiving elements 3b, namely the light receiving element 3b, the light emitting element 3a, and the light receiving element 3b are successively arranged in a row in the order named in the X direction, so that the one light emitting element 3a lies between the two light receiving elements 3b. In this description, for purposes of convenience, the two light receiving elements 3b are occasionally referred to as the light receiving element 3b1 and the light receiving element 3b2, respectively. In this embodiment, specular reflected light from a to-be-irradiated object is detected by the light receiving element 3b1, and, diffuse (scattered) reflected light from the to-be-irradiated object is detected by the light receiving element 3b2. The light receiving element 3b1, the light emitting element 3a, and the light receiving element 3b2 are arranged in the X direction so that their centers in the Y direction are aligned with one another.

The thereby arranged light emitting element 3a and the light receiving elements 3b are formed integrally on the one principal face 30s of a single substrate 30. In this construction, the light emitting element 3a and the light receiving element 3b can be disposed in predetermined positions, thus achieving enhanced sensing capability. Moreover, as contrasted to the case of mounting the light emitting element 3a and the light receiving element 3b on an individual basis, the light emitting element 3a and the light receiving element 3b can be proximately arranged. This makes it possible to provide a compact light receiving/emitting element module 1. Although the present embodiment employs the construction in which the light emitting element 3a and the two light receiving elements 3b are formed integral with the substrate 30, it is also possible to use a single light emitting element 3a and a single light receiving element 3b, to mount the light emitting element 3a and the light receiving element 3b on an individual basis, to arrange an array of a plurality of integrally-formed light emitting elements 3a and an array of a plurality of integrally-formed light receiving elements 3b in a row, and to adopt a construction implemented by combining the above alternatives.

The optical element 4 is located away from the one principal face 30s of the substrate 30 in the Z direction. The optical element 4 has a first principal face 4s1 facing the one principal face 30s of the substrate 30, and a second principal face 4s2 located opposite to the first principal face 4s1. In other words, the second principal face 4s2 is a principal face opposed to the to-be-irradiated object.

The optical element 4 is held by a holding body 5 having a side wall configured so as to surround a region formed with the light emitting element 3a and the light receiving element 3b. The holding body 5 may be made of a light-blocking material to prevent external light from entering the light receiving element 3b without passing through the optical element 4.

The optical element 4 includes a first lens 4a configured to direct light from the light emitting element 3a, to the to-be-irradiated object, and a second lens 4b configured to direct light reflected from the to-be-irradiated object, to the light receiving element 3b. In this embodiment, a second lens 4b1 is provided in correspondence with the light receiving element 3b1, and a second lens 4b2 is provided in correspondence with the light receiving element 3b2. The first lens 4a and the second lens 4b are arranged side by side in the first direction. Moreover, the first lens 4a and the second lens 4b are joined to each other so that a curved surface defining the first lens 4a and a curved surface defining the second lens 4b intersect each other. In this embodiment, in the first direction, the second lens 4b1, the first lens 4a, and the second lens 4b2 are arranged side by side and are joined together. Note that, in this embodiment, the first lens 4a and the second lens 4b are formed so that the curved surface of one of the lenses is not joined to the other lens in the second direction.

The following describes the individual components in detail.

The wiring board 2 is electrically connected to the light receiving/emitting element 3 and a control circuit 101 so as to serve as a wiring board for applying a bias to the light emitting element 3a and the light receiving element 3b formed in the light receiving/emitting element 3, and for effecting electric signal transfer between the light receiving/emitting element 3 and the control circuit 101.

The substrate 30 is, as exemplified, made of a semiconductor material of one conductivity type. Although the concentration of impurities of one conductivity type is not limited to particular values, it is desirable to provide high electrical resistance. The present embodiment employs an n-type silicon (Si) substrate which is a silicon (Si) substrate containing phosphorus (P) as impurities of one conductivity type at a concentration in the range of $1 \times 10^{17}$ to $2 \times 10^{17}$ atoms/cm$^3$. As n-type impurities, in addition to phosphorus (P), use can be made of nitrogen ($N_2$), arsenic (As), antimony (Sb), and bismuth (Bi), for example. The doping concentration of the n-type impurities falls in the range of $1 \times 10^{16}$ to $1 \times 10^{20}$ atoms/cm$^3$. In what follows, n type is defined as one conductivity type, and p type is defined as reverse conductivity type.

On the upper surface of the substrate 30, the light emitting element 3a and the two light receiving elements 3b are arranged in a row in the first direction so that the light emitting element 3a lies between the light receiving elements 3b. The light emitting element 3a serves as a source of light which is applied to the to-be-irradiated object. Light emitted from the light emitting element 3a is reflected from the to-be-irradiated object, and then enters the light receiving element 3b. The light receiving element 3b serves as a light detection section for detecting incidence of light.

As shown in FIG. 2(a), the light emitting element 3a has the form of a multilayer body in which a plurality of semiconductor layers are laminated. The light emitting element 3a is formed by laminating a plurality of semiconductor layers on the upper surface of the substrate 30. The specific structure of the light emitting element 3a will hereafter be described.

On the upper surface of the substrate 30, there is formed a buffer layer 30a for alleviating the difference in lattice constant between the substrate 30 and a semiconductor layer (in this embodiment, an n-type contact layer 30b which will hereafter be described) laminated on the one principal face 30s of the substrate 30. The buffer layer 30a has the capability of alleviating the difference in lattice constant between the substrate 30 and the semiconductor layer formed on the one principal face 30s of the substrate 30 to reduce lattice defects, such as lattice strain, which occur between the substrate 30 and the semiconductor layer, and thus reducing lattice defects or crystal defects in the entire semiconductor layer formed on the one principal face 30s of the substrate 30. The buffer layer 30a and the semiconductor layer formed on the upper surface thereof may be formed by means of MOCVD (Metal-organic Chemical vapor Deposition).

The buffer layer 30a of the present embodiment is made of gallium arsenide (GaAs) free from impurities, and has a thickness of about 2 to 3 µm. In a case where the difference in lattice constant between the substrate 30 and the semiconductor layer laminated on the one principal face 30s of the substrate 30 is not so great, the buffer layer 30a may be omitted from the construction.

An n-type contact layer 30b is formed on the upper surface of the buffer layer 30a. The n-type contact layer 30b is made of gallium arsenide (GaAs) doped with, for example, silicon (Si) or selenium (Se) as n-type impurities. The doping concentration of the impurities falls in the range of about $1\times10^{16}$ to $1\times10^{20}$ atoms/cm$^3$. The n-type contact layer 30b has a thickness of about 0.8 to 1 µm.

In this embodiment, as the n-type impurities, silicon (Si) is doped at a doping concentration in the range of $1\times10^{18}$ to $2\times10^{18}$ atoms/cm$^3$. Part of the upper surface of the n-type contact layer 30b is left exposed, and, this exposed part is electrically connected, through a light emitting element-side first electrode 31a, to the wiring board 2 by means of wire bonding, flip-chip connection, or otherwise. The n-type contact layer 30b functions to lower the resistance of contact with the light emitting element-side first electrode 31a connected to the n-type contact layer 30b.

The light emitting element-side first electrode 31a is made of, for example, an alloy of gold (Au) and antimony (Sb), an alloy of gold (Au) and germanium (Ge), or an Ni-based alloy, and has a thickness of about 0.5 to 5 µm. Moreover, the first electrode 31a is disposed on an insulating layer 8 formed over the upper surface of the substrate 30 so as to cover the upper surface of the n-type contact layer 30b, and is thus electrically isolated from the substrate 30 and other semiconductor layer than the n-type contact layer 30b.

For example, the insulating layer 8 is formed of an inorganic insulating film such as a silicon nitride (SiNx) film or a silicon oxide (SiO$_2$) film, or an organic insulating film such as a polyimide film, and has a thickness of about 0.1 to 1 µm.

On the upper surface of the n-type contact layer 30b, there is formed an n-type clad layer 30c which functions to confine holes in an active layer 30d which will hereafter be described. The n-type clad layer 30c is made of aluminum gallium arsenide (AlGaAs) doped with, for example, silicon (Si) or selenium (Se) as n-type impurities. The doping concentration of the n-type impurities falls in the range of about $1\times10^{16}$ to $1\times10^{20}$ atoms/cm$^3$. The n-type clad layer 30c has a thickness of about 0.2 to 0.5 µm. In this embodiment, the n-type clad layer 30c is doped with silicon (Si) as the n-type impurities at a doping concentration in the range of $1'3 10^{17}$ to $5\times10^{17}$ atoms/cm$^3$.

On the upper surface of the n-type clad layer 30c, an active layer 30d is formed, and serves as a light emitting layer for emitting light under concentration and recombination of carriers such as electrons and holes. The active layer 30d is made of aluminum gallium arsenide (AlGaAs) free from impurities, and has a thickness of about 0.1 to 0.5 µm. Although the active layer 30d of the present embodiment is an impurity-free layer, the active layer 30d may be of either a p-type active layer containing p-type impurities or an n-type active layer containing n-type impurities, and a point of importance is that the active layer has to be smaller in band gap than the n-type clad layer 30c and a p-type clad layer 30e which will hereafter be described.

On the upper surface of the active layer 30d, a p-type clad layer 30e is formed, and functions to confine electrons in the active layer 30d. The p-type clad layer 30e is made of aluminum gallium arsenide (AlGaAs) doped with, for example, zinc (Zn), magnesium (Mg), or carbon (C) as p-type impurities. The doping concentration of the p-type impurities falls in the range of about $1\times10^{16}$ to $1\times10^{20}$ atoms/cm$^3$. The p-type clad layer 30e has a thickness of about 0.2 to 0.5 µm. In this embodiment, the p-type clad layer 30e is doped with magnesium (Mg) as the p-type impurities at a doping concentration in the range of $1\times10^{19}$ to $5\times10^{20}$ atoms/cm$^3$.

On the upper surface of the p-type clad layer 30e, a p-type contact layer 30f is formed. The p-type contact layer 30f is made of aluminum gallium arsenide (AlGaAs) doped with, for example, zinc (Zn), magnesium (Mg), or carbon (C) as p-type impurities. The doping concentration of the p-type impurities falls in the range of about $1\times10^{16}$ to $1\times10^{20}$ atoms/cm$^3$. The p-type contact layer 30f has a thickness of about 0.2 to 0.5 µm.

The p-type contact layer 30f is electrically connected, through a light emitting element-side second electrode 31b, to the wiring board 2 by means of wire bonding, flip-chip connection, or otherwise. The p-type contact layer 30f functions to lower the resistance of contact with the light emitting element-side second electrode 31b connected to the p-type contact layer 30f.

So long as the light emitting element-side first electrode 31a is provided as a discrete electrode for each light emitting element, there is no need to provide the light emitting element-side second electrode 31b for each light emitting element on an individual basis, and it is thus sufficient that at least one light emitting element-side first electrode 31a is provided as a common electrode. As a matter of course, the light emitting element-side first electrode 31a may be provided as a common electrode, and the light emitting element-side first electrode 31b may be provided as a discrete electrode for each light emitting element.

Moreover, on the upper surface of the p-type contact layer 30f, a cap layer which functions to protect the p-type contact layer 30f from oxidation may be formed. For example, the cap layer is made of gallium arsenide (GaAs) free from impurities, and has a thickness of about 0.01 to 0.03 µm.

For example, the light emitting element-side second electrode 31b is made of gold (Au) or aluminum (Al) in combination with nickel (Ni), chromium (Cr), or titanium (Ti) serving as an adherent layer, such as an alloy of AuNi, AuCr, AuTi, or AlCr, and has a thickness of about 0.5 to 5 µm. The second electrode 31*b* is disposed on an insulating layer 8 formed over the upper surface of the substrate 30 so as to cover the upper surface of the p-type contact layer 30*f*, and is thus electrically isolated from the substrate 30 and other semiconductor layer than the p-type contact layer 30*f*.

In the thereby constituted light emitting element 3*a*, upon application of a bias between the light emitting element-side first electrode 31*a* and the light emitting element-side second electrode 31*b*, the active layer 30*d* gives forth light. Thus, the light emitting element 3*a* serves as a light source.

Figure 2:
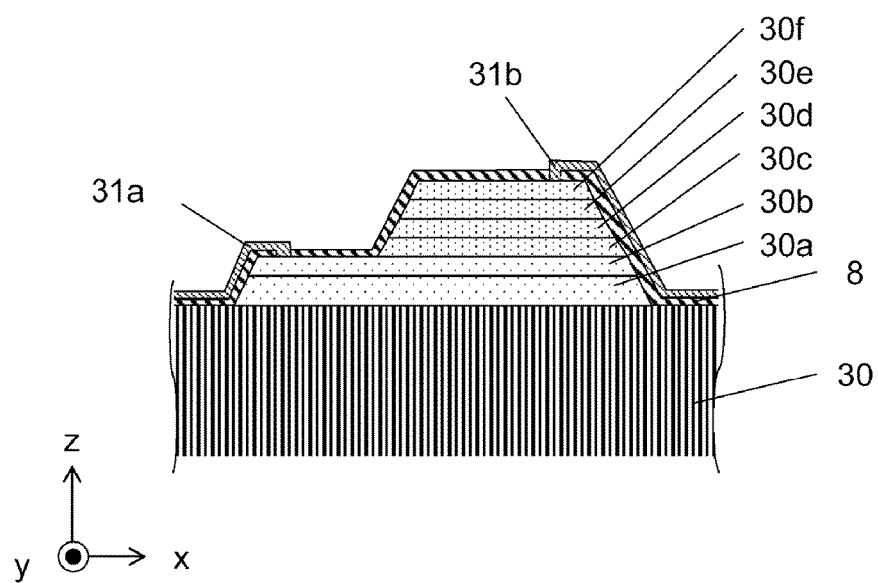
FIG. 2(a) is a sectional view of a light emitting element constituting the light receiving/emitting element module shown in FIG. 1.
FIG. 2(b) is a sectional view of a light receiving element constituting the light receiving/emitting element module shown in FIG. 1.
Figure 2:
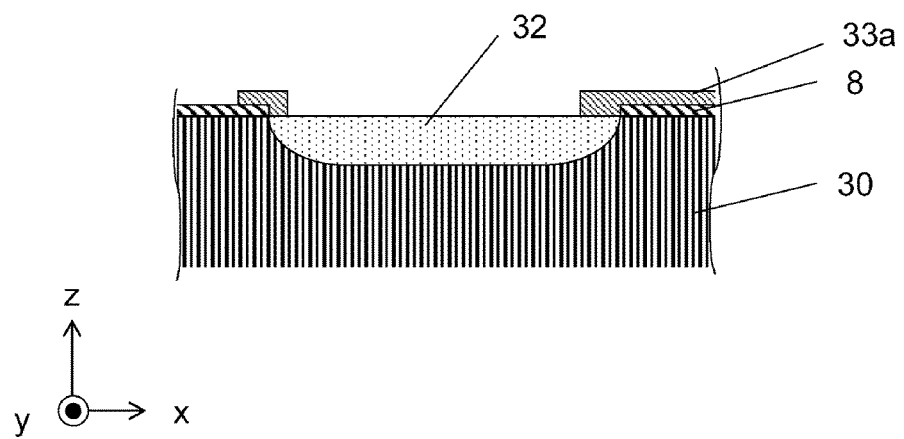

As shown in FIG. 2(*b*), the light receiving element 3*b* is constituted by providing a p-type semiconductor region 32 at the one principal face 30*s* of the substrate 30 so as to form a p-n junction in conjunction with the n-type substrate 30. The p-type semiconductor region 32 is formed by diffusing p-type impurities into the substrate 30 at high concentration. Examples of the p-type impurities include zinc (Zn), magnesium (Mg), carbon (C), boron (B), indium (In), and selenium (Se). The doping concentration of the p-type impurities falls in the range of $1\times10^{16}$ to $1\times10^{20}$ atoms/cm$^3$. In this embodiment, boron (B) is diffused as the p-type impurities so that the p-type semiconductor region 32 has a thickness of about 0.5 to 3 µm.

The p-type semiconductor region 32 is electrically connected to a light receiving element-side first electrode 33*a*. Although not shown in the drawing, the substrate 30 constructed of an n-type semiconductor makes electrical connection with a light receiving element-side second electrode 33*b*.

The light receiving element-side first electrode 33*a* is disposed on the upper surface of the substrate 30, with an insulating layer 8 interposed in between, and is thus electrically isolated from the substrate 30.

The light receiving element-side first electrode 33*a* and the light receiving element-side second electrode 33*b* are made of, for example, an alloy of gold (Au) and chromium (Cr), an alloy of aluminum (Al) and chromium (Cr), or an alloy of platinum (Pt) and titanium (Ti), and have a thickness of about 0.5 to 5 µm.

In the thereby constituted light receiving element 3*b*, upon incidence of light on the p-type semiconductor region 32, photoelectric current is generated under the photoelectric effect, and, the photoelectric current is taken out via the light receiving element-side first electrode 33*a*. Thus, the light receiving element 3*b* serves as a light detection section. Note that application of a reverse bias between the light receiving element-side first electrode 33*a* and the light receiving element-side second electrode 33*b* is desirable from the standpoint of improving the light detection sensitivity of the light receiving element 3*b*.

The holding body 5 is disposed on the upper surface of the wiring board 2. The sidewall portion of the holding body 5 is joined to the upper surface of the wiring board 2 so as to surround the light receiving/emitting element 3. The joining together of these components may be accomplished with use of an adhesive or an engagement member. The holding body 5 functions to prevent the light emitted from the light emitting element 3*a* from scattering in other direction than the direction toward the to-be-irradiated object, to prevent incidence of other light than the light reflected from the to-be-irradiated object upon the light receiving element 3*b*, and to provide protection for the wiring board 2 and the light receiving/emitting element 3 against an external environment.

Such a holding body 5 is made of a general-purpose plastics material such as polypropylene resin (PP), polystyrene resin (PS), vinyl chloride resin (PVC), polyethylene terephthalate resin (PET), and acrylonitrile butadiene styrene resin (ABS), an engineering plastics material such as polyamide resin (PA) and polycarbonate resin (PC), a super engineering plastics material such as liquid crystalline polymer, or a metal material such as aluminum (Al) and titanium (Ti), or may be composed of a combination of a plurality of these materials.

Although the holding body 5 of the present embodiment is equal in depthwise and widthwise dimensions to the wiring board 2, the holding body 5 does not necessarily have to have the same size as that of the wiring board 2, and it is thus sufficient that the holding body 5 is given a size large enough to cover at least the light emitting element 3*a* and the light receiving element 3*b*.

The upper wall of the holding body 5 is disposed so as to cover, in conjunction with the sidewall portion, the wiring board 2 and the light receiving/emitting element 3. The upper wall of the present embodiment abuts on the sidewall portion. Moreover, the upper wall acts also to support the optical element 4 which will hereafter be described.

The upper wall of the holding body 5 is made of a material similar to that used for the sidewall portion. The sidewall portion and the upper wall of the present embodiment are formed integral with each other from polycarbonate resin (PC) by means of injection molding. The upper wall has a light passageway formed in an area thereof where the optical element 4 is disposed. The light passageway is, as exemplified, made as an opening.

The optical element 4 is integrally formed so that the first lens 4*a* and the second lens 4*b* are joined to each other. The first lens 4*a* and the second lens 4*b* are integrated so that their curved surfaces defining the first lens 4*a* and the second lens 4*b* are joined to each other. In other words, an imaginary extended line representing the radius of curvature of the curved surface defining the first lens 4*a* and an imaginary extended line representing the radius of curvature of the curved surface defining the second lens 4*b* intersect each other. In this example, the second lenses 4*b* are arranged one at each side of the first lens 4*a* in the first direction so that their centers in the second direction are aligned with one another. Accordingly, when viewed in a thickness-wise section passing through the centers of the lenses 4*a* and 4*b*, the lens curved surface on one side of the first lens 4*a* is connected to the lens curved surfaces on one side of the second lenses 4*b*, and the lens curved surface on the other side of the first lens 4*a* is connected to the lens curved surfaces on the other side of the second lenses 4*b*.

With this configuration, the light emitting element 3*a* and the light receiving element 3*b* can be proximately arranged. The proximate arrangement of the light emitting element 3*a* and the light receiving element 3*b* helps reduce the angle of incidence of the light emitted from the light emitting element 3*a* upon the to-be-irradiated object. Specifically, the incidence angle can be reduced to 15° or below, or can be further reduced to 5° or below. This value is very small compared to the value of an angle at which discrete light emitting element and light receiving element are mounted with respect to a reference plane as has been conventional (about 30°). The reduction of the incidence angle makes it possible to check the surface conditions of a minute region, and thereby enhance the sensing capability.

Each of the first lens 4*a* and the second lens 4*b* may be configured so that its dimension in the second direction is greater than its dimension in the first direction. That is, the first lens 4*a* and the second lens 4*b* are each designed so that the lens effective diameter in the second direction is larger than the lens effective diameter in the first direction. Expressed differently, the first lens 4a and the second lens 4b are in non-symmetrical relation between their contour in the first direction and their contour in the second direction. As a consequence, the first lens 4a and the second lens 4b are capable of providing adequate quantity of light.

In the optical element 4 of the present embodiment, as shown in FIG. 1, lens-defining curved surfaces of the first lens 4a and the second lens 4b may be joined to each other in both of the first principal face 4s1 and the second principal face 4s2, respectively. This makes it possible to condense light on the curved surface defining each principal face of the optical element 4 with ease, and thereby provide greater design flexibility in constructing the light receiving/emitting element module 1.

In each of the first lens 4a and the second lens 4b, the radius of curvature of the curved surface defining the first principal face 4s1 may be smaller than the radius of curvature of the curved surface defining the second principal face 4s2. This makes it possible to reduce the size of a recess formed by the joining together of the first lens 4a and the second lens 4b, and thereby provide greater design flexibility in constructing the light receiving/emitting element module 1, and also reduce accumulation of dust on the junction between the first lens 4a and the second lens 4b. For example, the radius of curvature of the curved surface defining the first principal face 4s1 of each of the first lens 4a and the second lens 4b is greater than or equal to 3 mm but less than or equal to 12 mm. Moreover, the radius of curvature of the curved surface defining the second principal face 4s2 of each of the first lens 4a and the second lens 4b is greater than or equal to 1 mm, for example.

Moreover, the proximate arrangement of the light emitting element 3a and the light receiving element 3b makes it possible to downsize the light receiving/emitting element module 1, as well as to, as described above, reduce the incidence angle, and thereby increase the distance to the to-be-irradiated object.

Examples of materials of the first lens 4a and the second lens 4b include: a thermosetting resin such as silicone resin, urethane resin, and epoxy resin; a plastics material such as a thermoplastics resin, e.g. polycarbonate resin, methyl polymethacrylate resin, and acryl resin; sapphire; and inorganic glass.

As the first lens 4a and the second lens 4b, use can be made of, for example, a cylindrical lens, a spherical lens, or a Fresnel lens which is made of silicone resin. Such lenses 4a and 4b are attached to the upper wall of the holding body 5 by an organic adhesive such as silicone resin. Moreover, the junction between the first lens 4a and the second lens 4b extends rectilinearly in a direction parallel to the Y direction, for example, as seen from above in the Z direction.

In this embodiment, when viewed in a see-through manner in the Z direction (the direction of thickness of the substrate 30), the center of the first lens 4a is out of registration with the center of the light emitting element 3a. For example, the positions of the first lens 4a and the light emitting element 3a may be adjusted so that the center of the first lens 4a is positioned on an imaginary line extending from the center of the light emitting element 3a while being inclined by 10° to 20° with respect to the Z direction (normal direction). With such an arrangement, of the light emitted from the light emitting element 3a, exiting light from an angular region having high emission intensity of the light emitting element 3a can be taken out efficiently, and also the to-be-irradiated object can be irradiated with light at a certain angle of incidence.

The optical element 4 may be constituted by forming a joining face at each of the first lens 4a and the second lens 4b, and then adhering the joining faces of the lenses to each other by an adhesive such as silicone resin. Moreover, the optical element 4 may also be constituted by forming the integrally-formed first and second lenses 4a and 4b by pouring the constituent material into one single mold or the like, and then curing the material. In another alternative, the optical element 4 may be constituted by bring lens cut pieces into contact with each other, and then fixing them together in a mechanical manner.

Modified Example 1

Configuration of Optical Element 4

Figure 3:
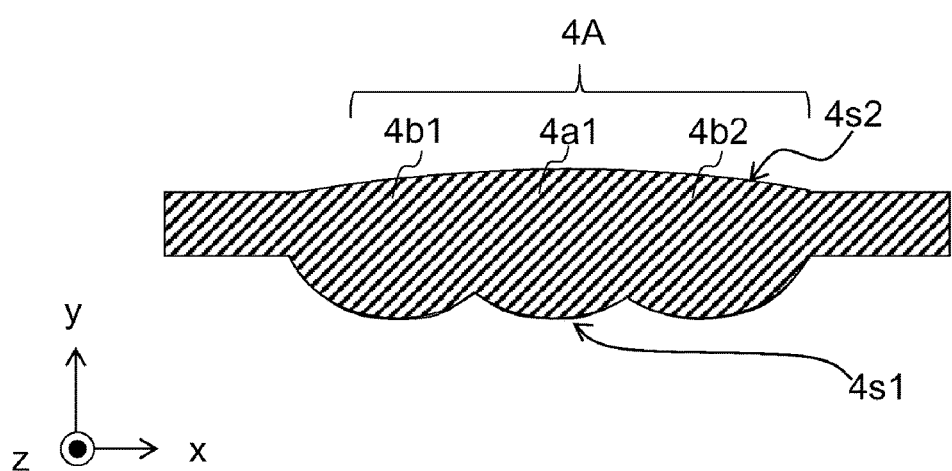
FIG. 3 is a schematic representation of a modified example of an optical element.

As shown in FIG. 3, the first lens 4a and the second lens 4b may be defined by a single curved surface at the second principal face 4s2. In this case, it never occurs that a recess is left at the junction between the first lens 4a and the second lens 4b on the second-principal-face 4s2 side of an optical element 4A, wherefore dust is less prone to be accumulated on the second-principal-face 4s2 side of the optical element 4A. Moreover, even if dust adheres to the second principal face 4s2 of the optical element 4A, the dust can be removed with ease.

The radius of curvature of the single curved surface constituted by the first lens 4a and the second lens 4b may be greater than the radius of curvature of the curved surface defining the first principal face 4s1 of each of the first lens 4a and the second lens 4b. This makes it possible to render the single curved surface constituted by the first lens 4a and the second lens 4b substantially flat, and thereby require only a small space for the placement of the light receiving/emitting element module 1. For example, the radius of curvature of the curved surface defining the first principal face 4s1 of each of the first lens 4a and the second lens 4b is greater than or equal to 3 mm but less than or equal to 12 mm. Moreover, the radius of curvature of the single curved surface constituted by the first lens 4a and the second lens 4b is greater than or equal to 1 mm, for example.

Modified Example 2

Light Control Member 6

Figure 4:
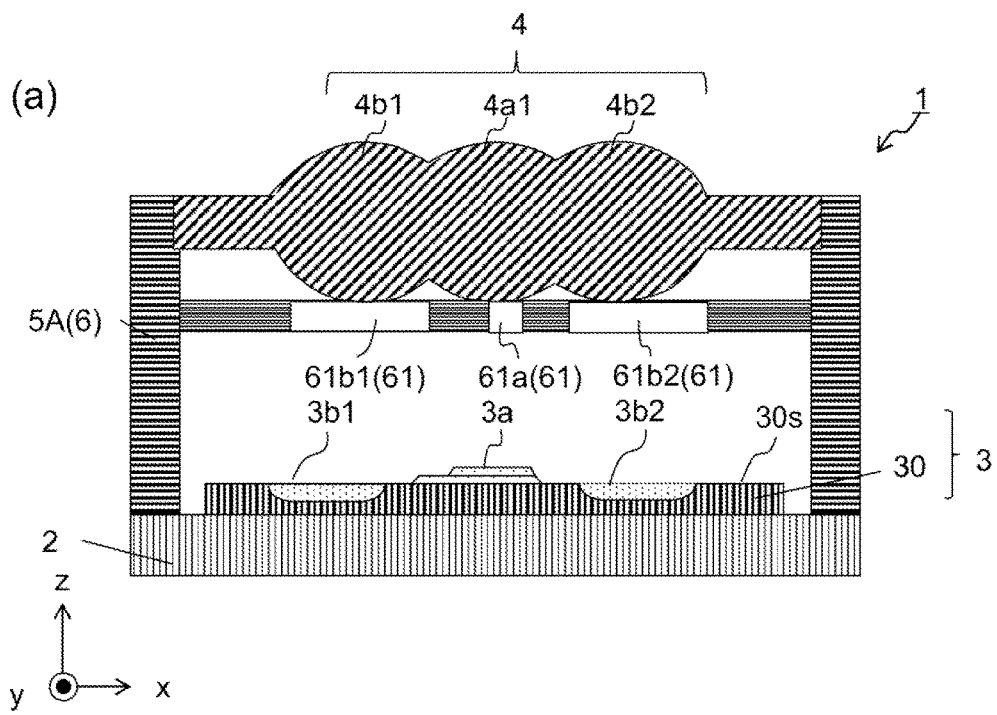
FIGS. 4(a) and 4(b) are a schematic sectional view and a schematic top view, respectively, showing a modified example of the light receiving/emitting element module shown in FIG. 1.
Figure 4:
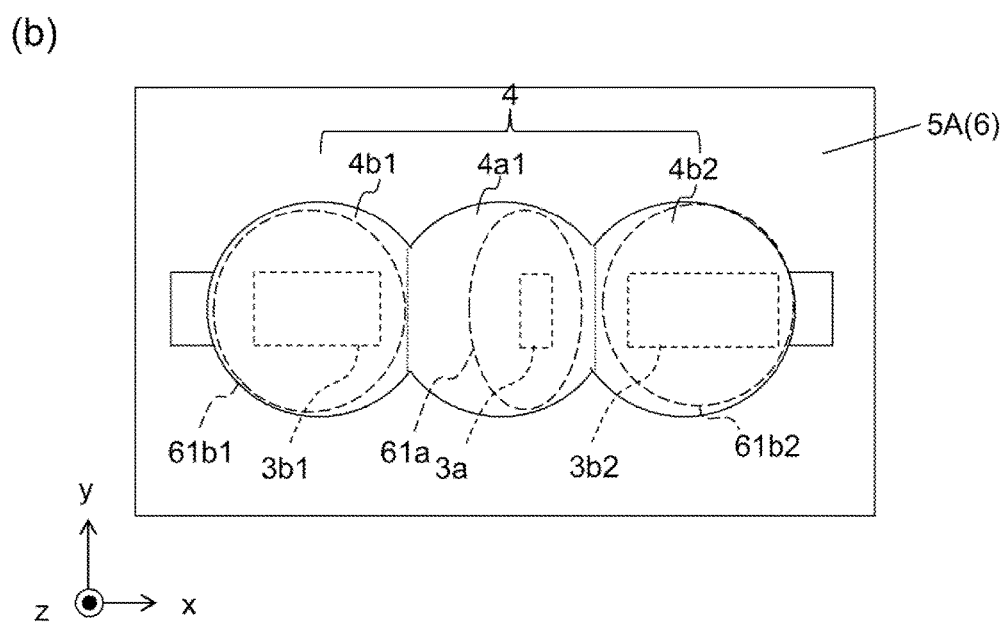

As shown in FIG. 4, a light control member 6 may be disposed between the optical element 4 and the light emitting element 3a, as well as the light receiving element 3b. The light control member 6 comprises a light passing section 61 configured to allow passage of light from the light emitting element 3a which is applied to the to-be-irradiated object and passage of reflected light from the to-be-irradiated object which is received by the light receiving element 3b. Thus, the light control member 6 functions to adjust the optical path of the light emitted from the light emitting element 3a, and to reduce reception of stray light by the light receiving element 3b. For example, the light control member 6 is shaped in a plate.

For example, the light control member 6 is made of a general-purpose plastics such as polypropylene resin (PP), polystyrene resin (PS), vinyl chloride resin (PVC), polyethylene terephthalate resin (PET), and acrylonitrile butadiene styrene resin (ABS), an engineering plastics such as polyamide resin (PA) and polycarbonate resin (PC), a super engineering plastics such as liquid crystalline polymer, or a metal material such as aluminum (Al) and titanium (Ti).

That is, the light control member 6 is made of a resin material or a metal material. Moreover, for example, the light control member 6 is made of a light-transmittable material, a light-absorbing material, or a light-blocking material. The light control member 6 according to the present embodiment is made of a resin material having light-blocking capability.

The light control member 6 may be provided separately from the holding body 5, and may be joined to the holding body 5. Alternatively, as shown in FIG. 4, a holding member 5A may be prepared as the light control member 6, and the light passing section 61 (a first light passing section 61a and a second light passing section 61b) may be formed on the upper wall of the holding member 5A.

The light passing section 61 of the light control member 6 may have the first light passing section 61a in the form of a through hole formed through the light control member 6 so as to lie between the light emitting element 3a and the first lens 4a, and the second light passing section 61b in the form of a through hole formed through the light control member 6 so as to lie between the light receiving element 3b and the second lens 4b. In FIG. 4(b), in the interest of clarity of relative positions of individual constituent components, the light emitting section of the light emitting element 3a, the light receiving section of the light receiving element 3b, the first light passing section 61a, and the second light passing section 61b are indicated by broken lines. In this embodiment, there are provided a plurality of second light passing sections 61b, namely a second light passing section 61b1 corresponding to the light receiving element 3b1 and the second lens 4b1, and a second light passing section 61b2 corresponding to the light receiving element 3b2 and the second lens 4b2.

The dimension of the first light passing section 61a in the first direction may be smaller than the dimension of the first lens 4a in the first direction. This makes it possible to, for example, reduce the possibility that light from the light emitting element 3a will not enter the first lens 4a and consequently become stray light.

The dimension of the second light passing section 61b in the first direction may be smaller than the dimension of the second lens 4b in the first direction. This makes it possible to, for example, reduce the possibility that light from other region than the second lens 4b (stray light) will be received by the light receiving element 3b.

The first light passing section 61a and the second light passing section 61b may be provided independently of each other, and, the light control member 6 may be provided with a light-blocking region disposed between the first light passing section 61a and the second light passing section 61b. In this case, the light control member 6 serves to separate the optical element 4 and the space in which the light emitting element 3a and the light receiving element 3b are arranged. Such a light control member 6 achieves separation between light directed to the first lens 4a from the light emitting element 3a and light directed to the light receiving element 3b from the second lens 4b. Accordingly, even if the light emitting element 3a and the light receiving element 3b are proximately arranged, it is possible to reduce the influence of unintended light from the light emitting element 3a and light unintendedly directed to the light receiving element 3b. In this embodiment, other part of the light control member 6 than the first light passing section 61a and the second light passing section 61b exhibits light-blocking capability.

Moreover, in this embodiment, the first light passing section 61a may be configured so that its dimension in the second direction is greater than its dimension in the first direction. That is, since the first lens 4a is designed so that its effective diameter in the second direction is larger than its effective diameter in the first direction, by making proper adjustment to the size of the first light passing section 61a in conformity with the design of the first lens 4a, it is possible to direct larger quantity of light from the light emitting element 3a to the first lens 4a. Such a first light passing section 61a may be either rectangular shaped or elliptically shaped. Moreover, the size of the second light passing section 61b may be increased insofar as possible in accordance with the effective diameter of the second lens 4b to direct larger quantity of light to the light receiving element 3b.

Moreover, as described above, since the light passing section 61 has the form of a through hole formed through the light control member 6, for example, as contrasted to a case where the light passing section 61 is made of a light-transmittable material, it is possible to facilitate reduction in light loss which occurs during the passage of light from the light emitting element 3a through the light passing section 61.

In this embodiment, when viewed in a see-through manner in the Z direction, the center of the first lens 4a, the center of the light emitting element 3a, and the center of the first light passing section 61a are out of registration with one another. Specifically, the positions of the first lens 4a, the light emitting element 3a, and the first light passing section 61a may be adjusted so that the center of the first light passing section 61a is positioned on an imaginary line which extends from the center of the light emitting element 3a and is inclined by 10° to 20° with respect to the Z direction.

Modified Example 3

Junction Between First Lens 4a and Second Lens 4b

Figure 5:
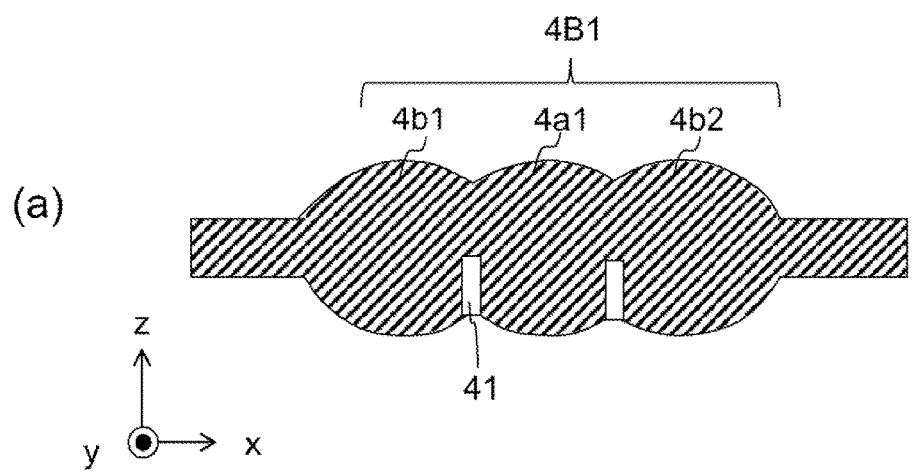
FIGS. 5(a) and 5(b) are schematic representations of a modified example of the optical element, respectively.
Figure 5:
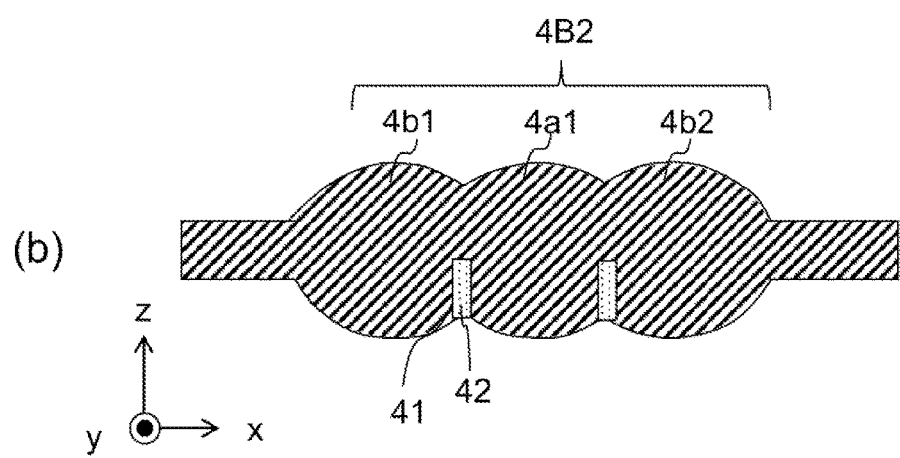

A light receiving/emitting element module 1B may be provided with, instead of the above-described optical element 4, optical elements 4B1 and 4B2 as shown in FIGS. 5(a) and 5(b). As shown in FIG. 5(a), in the optical element 4B1, a slot 41 is formed at the junction between the first lens 4a and the second lens 4b. The formation of the slot 41 helps reduce the influence of unintended light from the light emitting element 3a and light unintendedly directed to the light receiving element 3b.

The size of the slot 41 is not limited to particular values so long as it is less than the distance between the first light passing section 61a and the second light passing section 61b. For example, in the case of using lenses having NA of 0.5 mm as the first and second lenses 4a and 4b, the slot 41 is designed to have a width of 100 to 300 μm and a depth of 200 to 800 μm. Moreover, while the inner wall of the slot 41 may be machined to have a mirror finished surface, the surface of inner wall may be roughened by means of embossment or otherwise to reduce the influence of direct light.

Moreover, the slot 41 may be located on a first principal face 4s1 side of the optical element 4B2. In this case, as contrasted to a case where the slot 41 is located on a second principal face 4s2 side of the optical element 4B2, it is possible to, for example, reduce the intrusion of dust into the slot 41, and thereby reduce loss of light, for example.

Moreover, as practiced in the optical element 4B2 shown in FIG. 5(b), the slot 41 may be formed with a filler portion 42 made of a light-blocking material, a light absorber, or a material which is smaller in refractive index than the first and second optical lenses 4a and 4b. Also in this case, the influence of unintended light from the light emitting element 3a and light unintendedly directed to the light receiving element 3b can be reduced, and light separation can be achieved. It is desirable to use, as the filler portion 42, a material which readily fills the slot and is capable of stress relaxation, and exemplary of such a material is silicone- or polycarbonate-based black organic resin.

Modified Example 4

Junction Between First Lens 4a and Second Lens 4b

Figure 6:
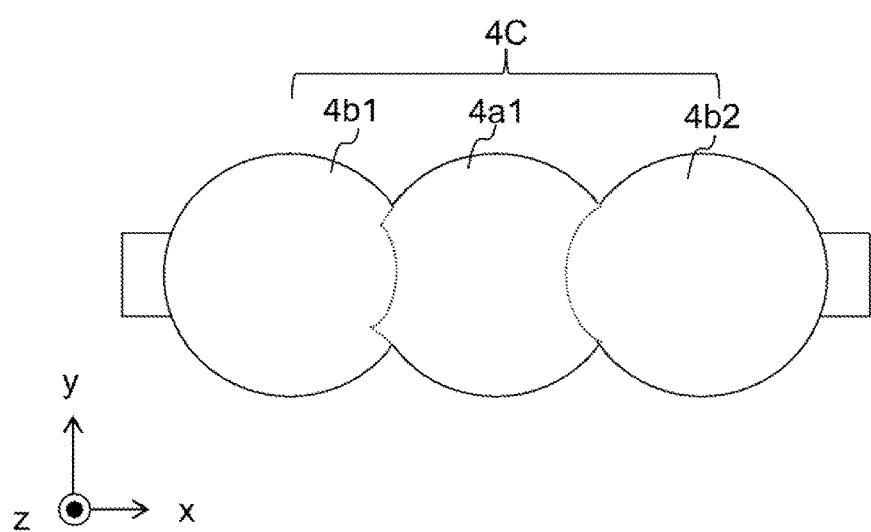
FIG. 6 is a schematic representation of a modified example of the optical element.

FIG. 6 is a top view of the major part of a light receiving/emitting element module 10 as seen in a see-through manner in a direction perpendicular to the XY plane. As shown in FIG. 6, the light receiving/emitting element module 10 may be provided with an optical element 4C in which the junction between the first lens 4a and the second lens 4b extends in non-parallel relation to the second direction (Y direction) on the XY plane.

As shown in FIG. 6, when it is desired to obtain larger quantity of light from the light emitting element 3a, the first lens 4a and the second lens 4b may be joined to each other so that the junction gradually protrudes from a first lens 4a side toward a second lens 4b1 side as a distance from the midportion in the second direction increases. Moreover, in a case where diffuse reflected light is received by the light receiving element 3b2, to increase the intensity of received light, the first lens 4a and the second lens 4b may be joined to each other so that the junction gradually protrudes from a second lens 4b2 side toward the first lens 4a side as a distance from the midportion in the second direction increases.

Modified Example 5

First Lens 4a and Second Lens 4b

Figure 7:
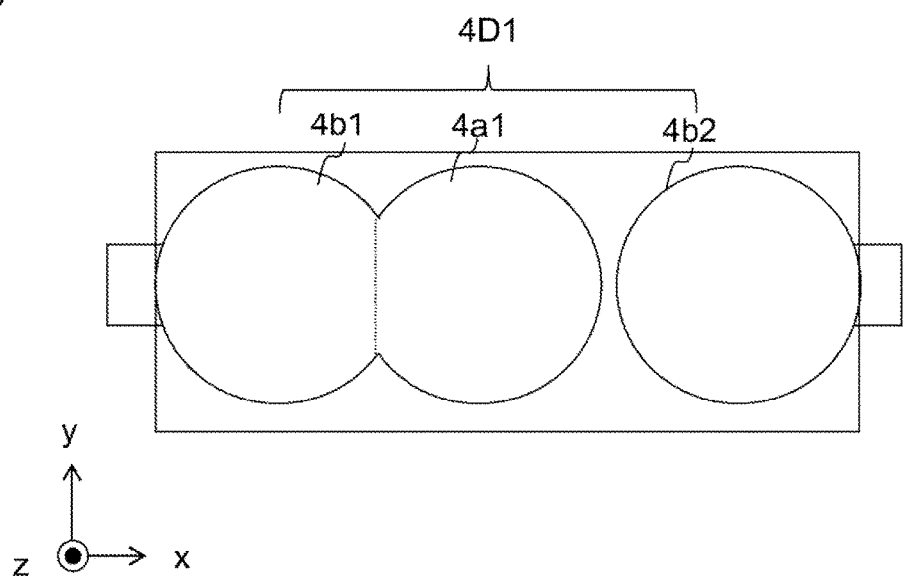
FIGS. 7(a) and 7(b) are schematic representations of a modified example of the optical element, respectively.
Figure 7:
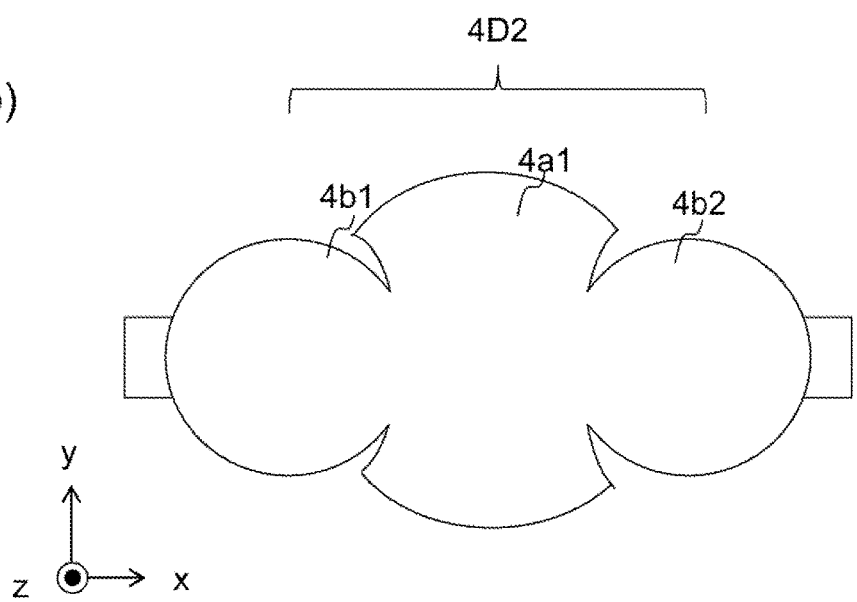

In a light receiving/emitting element module 1D, as shown in FIG. 7(a), only the first lens 4a and the second lens 4b1 may be joined together, and the second lens 4b2 may be left unconnected. Moreover, as shown in FIG. 7(b), radii of curvature of the first lens 4a and the second lens 4b may be different from each other. This configuration makes it possible to provide greater design flexibility in constructing the light receiving/emitting element module 1D.

Modified Example 6

Substrate 30

Although the foregoing description deals with the case where a semiconductor material is used for the substrate 30, and the light receiving element 3b is formed in part of the substrate 30, a light receiving/emitting element module 1E comprising a substrate 30E may be adopted. The substrate 30E is not limited to one made of a semiconductor material, but may be of a SOI substrate, a SOS substrate, a substrate made of an insulating material, a resin substrate, and so forth. In this case, the light receiving element 3b and the light emitting element 3a formed respectively on separate substrates are bonded together, thus constituting the light receiving/emitting element module 1E comprising the light emitting element 3a and the light receiving element 3b mounted on one single substrate.

In this case, the use of a material having high heat-dissipation capability for the substrate 30E makes it possible to provide a light receiving/emitting element module having high heat-dissipation capability. In the case of using a wiring board with internal wiring, by virtue of easiness in electrical-wiring layout, higher degree of integration can be achieved. In this case, the substrate 30E is able to serve also as the wiring board 2. Moreover, by bonding the light emitting element 3a and the light receiving element 3b formed under optimal conditions to the substrate 30E, each constituent element affords enhanced performance capability.

Modified Example 6

Other Forms

Although the above-described embodiments employ the light receiving/emitting element 3 comprising one light emitting element 3a and two light receiving elements 3b, a combination of one light emitting element 3a and one light receiving element 3b, or a combination of one light emitting element 3a and three or more light receiving elements 3b arranged so as to surround the light emitting element 3a may be adopted. Moreover, an array of the light emitting elements 3a and an array of the light receiving elements 3b may be arranged side by side. In this case, the optical element 4 is formed in conformity with the arrangement of the light emitting elements 3a and the light receiving elements 3b.

Moreover, although the above-described embodiments employ the light receiving element 3b constructed of a p-n type photodiode, a P-I-n photodiode may also be used. In addition, the light receiving element 3b1 and the light receiving element 3b2 may be designed to have different sizes and shapes. Specifically, the light receiving element 3b2, which receives diffuse reflected light which is greater in the angle of reflection and in the extent of variation in reflection angle than specular reflected light, may be given a rectangular shape elongated in the first direction.

Moreover, although the above-described construction is capable of reducing the angle of incidence of light upon the to-be-irradiated object adequately compared to the prior art construction, by disposing a prism above the optical element 4, the incidence angle can be reduced even further.

(Sensor Device)

Figure 8:
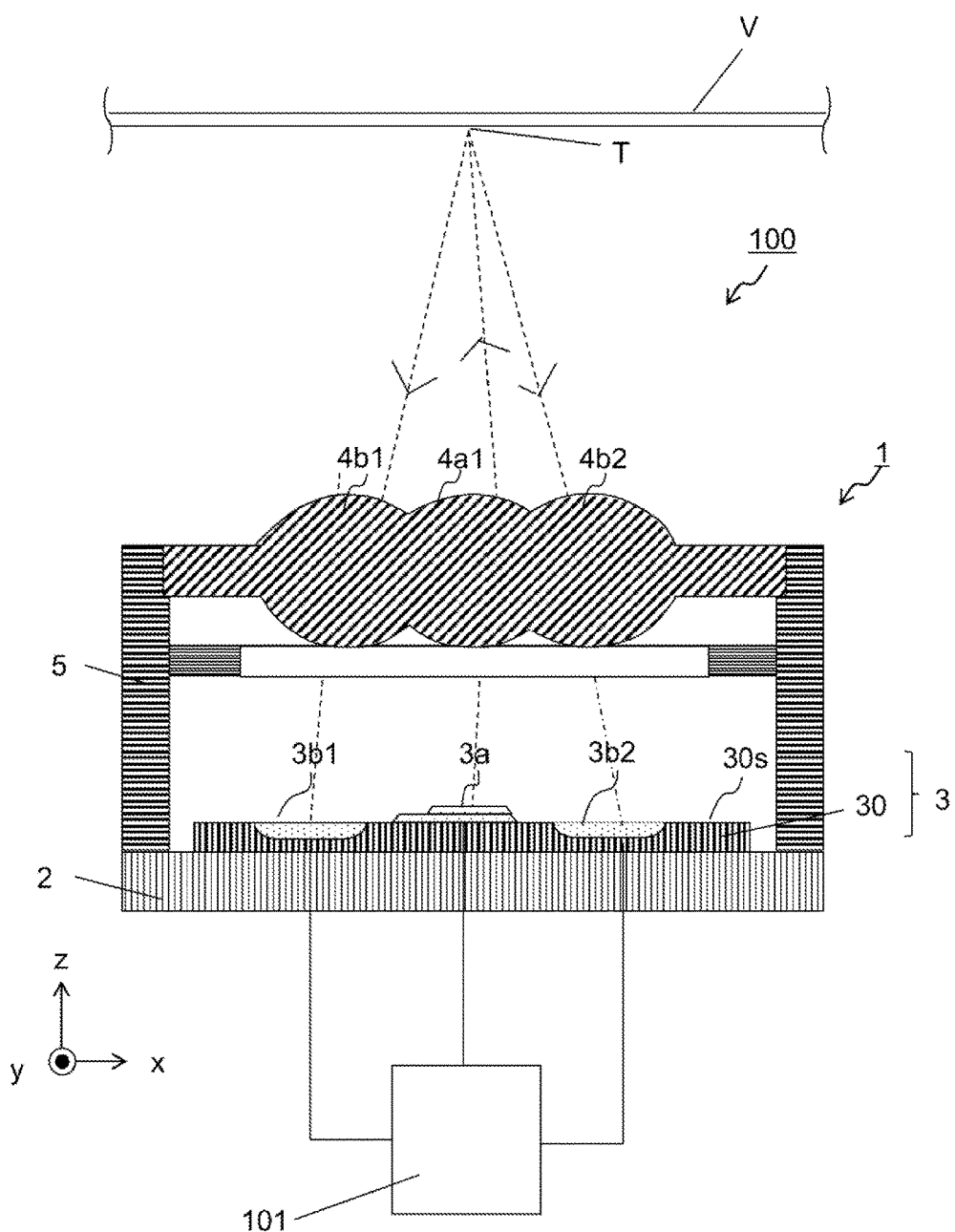
FIG. 8 is a schematic sectional view showing an embodiment of a sensor device employing the light receiving/emitting element module shown in FIG. 1.

Next, a sensor device 100 equipped with the light receiving/emitting element module 1 will be described. As shown in FIG. 8, the sensor device 100 in the present embodiment comprises the light receiving/emitting element module 1 and the control circuit 101 electrically connected to the light receiving/emitting element module 1. The control circuit 101 controls the light receiving/emitting element module 1. For example, the control circuit 101 includes a driving circuit for driving the light emitting element 3a, a computing circuit for processing electric current from the light receiving element 3b or a communications circuit for effecting communication with external equipment, and so forth.

The following describes a case where the light receiving/emitting element module 1 is applied to a sensor device for detecting the position of a toner T (to-be-irradiated object) which has adhered onto an intermediate transfer belt V in an image forming apparatus such as a copying machine or a printer.

The sensor device 100 is disposed so that a side of the light receiving/emitting element module 1 bearing the light emitting element 3a and the light receiving element 3b faces the intermediate transfer belt V. Light from the light emitting element 3a is applied to the toner T borne on the intermediate transfer belt V. In this embodiment, the light emitted from the light emitting element 3a enters the toner T borne on the intermediate transfer belt V through the first lens 4a. Then, specular reflected light L2 resulting relatively from the above incident light L1 is received, through the second lens 4b, by the light receiving element 3b. Photoelectric current responsive to the intensity of the received light is generated in the light receiving element 3b, and, this photoelectric current is detected by the control circuit 101.

As described above, the sensor device 100 in the present embodiment is capable of detecting photoelectric current responsive to the intensity of the specular reflected light from the toner T. Accordingly, for example, a large value of the photoelectric current detected in the light receiving element 3b indicates that the toner T is present at this position. In this way, the position of the toner T on the intermediate transfer belt V can be detected. Since the intensity of specular reflected light corresponds also to the concentration of the toner T, it is possible to detect the concentration of the toner T on the basis of the magnitude of generated photoelectric current. Similarly, since the intensity of specular reflected light corresponds also to a distance from the light receiving/emitting element 3 to the toner T, it is possible to detect the distance between the light receiving/emitting element 3 and the toner T on the basis of the magnitude of generated photoelectric current. Moreover, the intensity of specular reflected light and diffuse reflected light correspond also to information as to the surface such as asperity information and glossiness information, of the to-be-irradiated object, wherefore the surface information of the to-be-irradiated object can also be obtained.

The sensor device 100 in the present embodiment affords the aforestated advantageous effects brought about by the light receiving/emitting element module 1.

Figure 9:
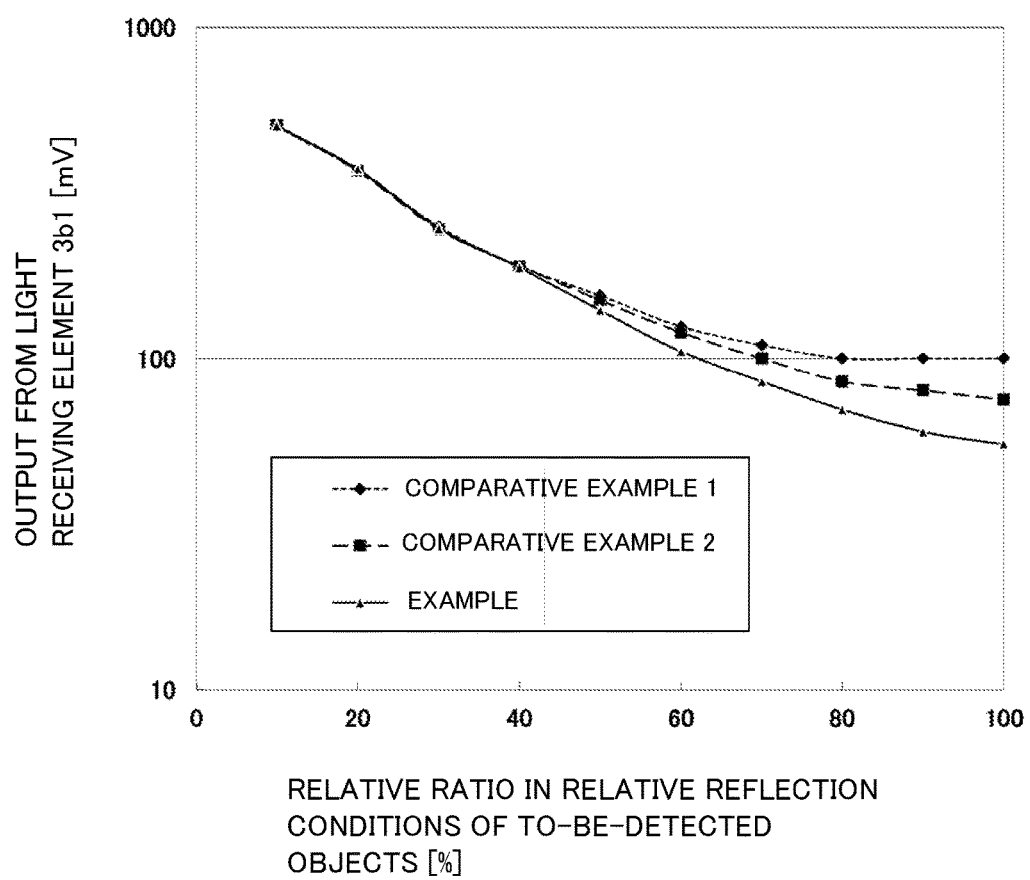
FIG. 9 is a chart indicating the correlation between the surface condition of a to-be-irradiated object and the magnitude of photoelectric current detected by the light receiving element in each of a sensor device using the light receiving/emitting element module in the present embodiment and a sensor device employing the light receiving/emitting element module in the comparative example.

In FIG. 9, there is shown the result of measurement on the sensing capability of the sensor device in the present embodiment (implemented as Example 1) and the sensing capabilities of Comparative examples 1 and 2. Comparative example 1 employs a cannonball-shaped light emitting component (LED component) and a PD component which are arranged so that their upper surfaces are inclined at an angle of 30° with respect to a to-be-irradiated surface. Comparative example 2 employs, instead of the optical element 4 of the sensor device 100, a plurality of independent lenses which are not joined to each other at intermediate points on their radii of curvature. With respect to each of a plurality of to-be-irradiated objects having different surface conditions, photoelectric current generated in the light receiving element 3b1 has been measured by each sensor device. The use of the to-be-irradiated objects of varying surface conditions makes it possible to cause relative changes of the reflectivity of incident light.

FIG. 9 has showed that, in Comparative examples 1 and 2, as the reflectivity of light incident upon the to-be-irradiated object changes (as the rate of toner coverage on the surface of the to-be-irradiated object changes), the rate of change decreases into saturation, causing deterioration in sensing capability. In contrast to this, in Example 1, it has been found that a relatively good linear relationship can be established between the rate of change in the reflectivity of light incident upon the to-be-irradiated object and the magnitude of photoelectric current. Example 1 has thus proven that it is capable of exhibiting excellent sensing capability without dependence upon the conditions of the to-be-irradiated object.

While particular embodiments of the invention have been shown and described heretofore, the application of the invention is not limited to them, and various changes and modifications may be made without departing from the scope of the invention.

For example, although the above description as to the light receiving/emitting element module 1 in the foregoing embodiment deals with a modified example of the light receiving/emitting element module 1 in which the light control member 6 is made of a light-blocking material, the light control member 6 may be made of a light-transmittable material. In this case, for example, the light control member 6 may be made of a light-transmittable resin material, and, a light-blocking member may be disposed in a part which is required to block light.

Moreover, although the above description as to the light receiving/emitting element module 1 in the foregoing embodiment deals with, as the optical element 4—forming method, the case where the constituent lenses are bonded to each other by an adhesive, a light-blocking adhesive may be used as the adhesive for bonding the first lens 4a and the second lens 4b together.

REFERENCE SIGNS LIST

1: Light receiving/emitting element module
2: Wiring board
3: Light receiving/emitting element
3a: Light emitting element
3b: Light receiving element
4: Optical element
4s1: First principal face
4s2: Second principal face
4a: First lens
4b: Second lens
5: Holding body
6: Light control member
61: Light passing section
61a: First light passing section
61b: Second light passing section
8: Insulating layer
30: Substrate
30s: One principal face
30a: Buffer layer
30b: N-type contact layer
30c: N-type clad layer
30d: Active layer
30e: P-type clad layer
30f: P-type contact layer
31a: Light emitting element-side first electrode
31b: Light emitting element-side second electrode
32: P-type semiconductor region
33a: Light receiving element-side first electrode
33b: Light receiving element-side second electrode
100: Sensor device
101: Control circuit

The invention claimed is:

1. A light receiving/emitting element module, comprising:
a substrate;
a light emitting element disposed on one principal face of the substrate;
two light receiving elements disposed on the one principal face of the substrate and disposed side by side in a first direction, the light emitting element being interposed between the two light receiving elements; and
an optical element located away from the one principal face of the substrate,
the optical element comprising a first principal face facing the one principal face, and a second principal face opposed to the first principal face, the optical element comprising a first lens configured to direct light from the light emitting element, to a to-be-irradiated object, and two second lenses configured to direct specular reflected light and diffuse reflected light which are reflected from the to-be-irradiated object, to the two light receiving elements, respectively, the first lens and the two second lenses being disposed side by side in the first direction, the two second lenses being arranged one at each side of the first lens in the first direction, both sides of a curved surface defining the first lens and curved surfaces defining the two second lenses which are disposed on at least one of the first principal face and the second principal face, intersecting each other, respectively, both sides of a curved surface at the first principal face of the first lens and curved surfaces at the first principal face of the two second lenses are joined to each other, respectively, and both sides of a curved surface at the second principal face of the first lens and curved surfaces at the second principal face of the second lenses are joined to each other, respectively, in each of the first lens and the two second lenses, a radius of curvature of the curved surface at the first principal face being smaller than a radius of curvature of the curved surface at the second principal face.

2. The light receiving/emitting element module according to claim 1,
wherein the first lens and the two second lenses are defined by a single curved surface at the second principal face.

3. The light receiving/emitting element module according to claim 2, wherein a radius of curvature of the single curved surface constituted by the first lens and the two second lenses is greater than a radius of curvature of the curved surface at the second principal face of each of the first lens and the two second lenses.

4. The light receiving/emitting element module according to claim 1,
wherein the optical element comprise a slot located at a junction between the first lens and each of the two second lenses.

5. The light receiving/emitting element module according to claim 4,
wherein the slot is located on a first principal face side of the optical element.

6. The light receiving/emitting element module according to claim 1,
wherein a junction between the first lens and each of the two second lenses extends in non-parallel relation to a second direction which is perpendicular to the first direction and runs along the one principal face of the substrate.

7. The light receiving/emitting element module according to claim 1, further comprising:
a light control member disposed among the optical element, and the two light emitting elements and the light receiving element,
the light control member comprising a light passing section configured to allow passage of light emitted from the light emitting element and passage of light received by the two light receiving elements.

8. The light receiving/emitting element module according to claim 7,
wherein the light passing section includes a first light passing section located between the light emitting element and the first lens, and
a dimension of the first light passing section in the first direction is smaller than a dimension of the first lens in the first direction.

9. The light receiving/emitting element module according to claim 7,
wherein the light passing section includes a second light passing section located between the light emitting element and each of the second lenses, and
a dimension of the second light passing section in the first direction is smaller than a dimension of the second lenses in the first direction.

10. The light receiving/emitting element module according to claim 8,
wherein the first light passing section is configured so that its dimension in a second direction which is perpendicular to the first direction and runs along the one principal face of the substrate is greater than its dimension in the first direction.

11. The light receiving/emitting element module according to claim 7,
wherein the light passing section is a through hole formed through the light control member.

12. The light receiving/emitting element module according to claim 1,
wherein the substrate has semiconductor material of one conductivity type,
the light emitting element is a multilayer body comprising a plurality of semiconductor layers disposed on the one principal face of the substrate, and
each of the two light receiving elements has a region containing impurities of reverse conductivity type located at the one principal face of the substrate.

13. A sensor device, comprising:
the light receiving/emitting element module according to claim 1; and
a control circuit which is electrically connected to the light receiving/emitting element module and configures to control the light receiving/emitting element module,
light being applied to a to-be-irradiated object from the light emitting element, and based on current outputs which are outputted from the two light receiving elements in response to reflected light from the to-be-irradiated object, at least one of positional information, distance information, and surface information as to the to-be-irradiated object being detected.

14. The light receiving/emitting element module according to claim 1,
wherein each of the first lens and the two second lenses is configured so that its dimension in a second direction which is perpendicular to the first direction and a normal to the one principal face of the substrate is greater than its dimension in the first direction.

* * * * *